United States Patent
Chan et al.

(10) Patent No.: US 8,320,120 B1
(45) Date of Patent: Nov. 27, 2012

(54) REVERSIBLE AIR FLOW FAN SYSTEM

(75) Inventors: Kum Cheong Adam Chan, Singapore (SG); Chi Hock Goh, Singapore (SG); Poh Boon Teo, Singapore (SG); Robert W. Dobbs, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1012 days.

(21) Appl. No.: 12/340,314

(22) Filed: Dec. 19, 2008

(51) Int. Cl.
*H05K 7/20* (2006.01)

(52) U.S. Cl. ........... 361/679.49; 361/679.46; 361/679.5; 361/695; 165/121; 165/122; 165/185

(58) Field of Classification Search ............ 361/679.46–679.53, 690–967; 415/61, 68, 193, 206.1, 415/209.1; 417/360, 423.5; 454/184; 165/80.3, 165/104.33, 121–126
See application file for complete search history.

(56) References Cited

U.S. PATENT DOCUMENTS

| | | | | |
|---|---|---|---|---|
| 6,054,823 | A * | 4/2000 | Collings et al. | 318/400.04 |
| 6,720,774 | B2 * | 4/2004 | Meert et al. | 324/512 |
| 7,264,490 | B1 * | 9/2007 | Reznikov | 439/152 |
| 7,434,743 | B2 * | 10/2008 | Barsun et al. | 236/49.3 |
| 7,492,591 | B1 * | 2/2009 | Aybay et al. | 361/695 |
| 7,675,747 | B1 * | 3/2010 | Ong et al. | 361/679.48 |
| 7,729,116 | B1 * | 6/2010 | Aybay et al. | 361/695 |
| 7,983,039 | B1 * | 7/2011 | Nguyen et al. | 361/695 |
| 8,068,340 | B1 * | 11/2011 | Nguyen et al. | 361/695 |
| 2009/0190625 | A1 * | 7/2009 | Chung et al. | 374/11 |

* cited by examiner

*Primary Examiner* — Michail V Datskovskiy

(57) ABSTRACT

A reversible air flow fan system is described. A fan tray assembly is coupled with a chassis and a removable fan and bracket assembly that is oriented in a first direction. This removable fan and bracket assembly is configured to be removable from the fan tray assembly and being recoupled with the fan tray assembly in a second direction opposite the first direction. An air duct is coupled with and enables the exchange of air between the removable fan and bracket assembly and a first surface of the chassis. A sensor coupled with the fan tray assembly is configured for coupling with at least one bracket of the removable fan and bracket assembly when the removable fan and bracket assembly is oriented in the first direction.

18 Claims, 6 Drawing Sheets

REVERSIBLE AIR FLOW FAN SYSTEM

FIELD

The field of the present invention relates to computing systems. More particularly, embodiments of the present invention relate to server racks.

BACKGROUND

Generally, computers are part of a person's everyday experience. While an individual user may just have one or two personal computers, a large corporation has a multitude of computers that may be stacked in datacenter racks. These datacenter racks may then be accessed by human operators for maintenance and repair purposes. Organizing datacenter racks into the same general area saves space and money.

However, there are some limitations to datacenter racks. For example, datacenter racks and the switches therein may be difficult to access due to design limitations, thereby inhibiting their functionality.

BRIEF DESCRIPTION OF THE DRAWINGS

The accompanying drawings, which are incorporated in and form a part of this specification, illustrate embodiments of the present technology for a reversible air flow fan system and, together with the description, serve to explain principles discussed below.

Figure 1:
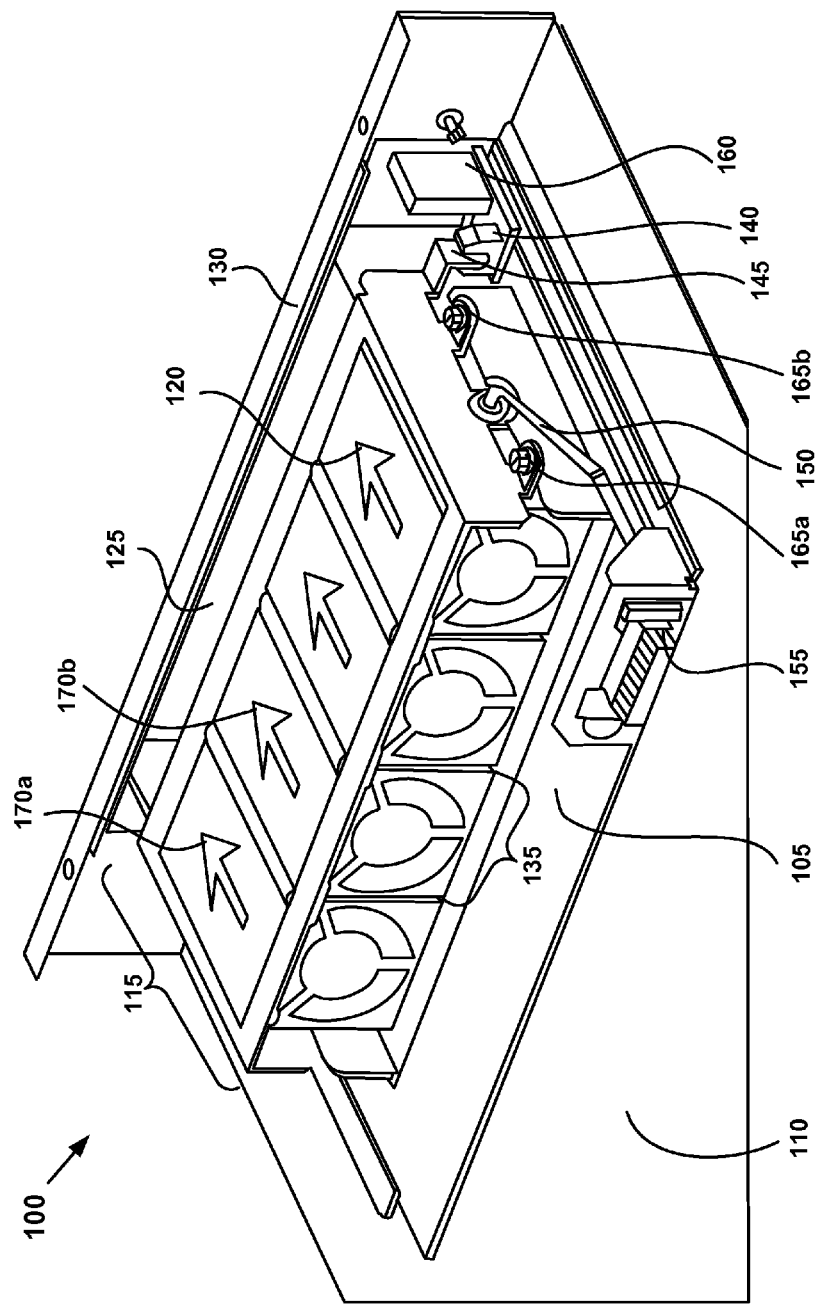
FIG. 1 is a block diagram of an example reversible air flow fan system in accordance with embodiments of the present technology.

The drawings referred to in this description should not be understood as being drawn to scale unless specifically noted.

DESCRIPTION OF EMBODIMENTS

Reference will now be made in detail to embodiments of the present technology, examples of which are illustrated in the accompanying drawings. While the present technology will be described in conjunction with various embodiment(s), it will be understood that they are not intended to limit the present technology to these embodiments. On the contrary, the present technology is intended to cover alternatives, modifications and equivalents, which may be included within the spirit and scope of the various embodiments as defined by the appended claims.

Furthermore, in the following detailed description, numerous specific details are set forth in order to provide a thorough understanding of embodiment of the present technology. However, embodiments of the present technology may be practiced without these specific details. In other instances, well known methods, procedures, components, and circuits have not been described in detail as not to unnecessarily obscure aspects of the present embodiments.

Unless specifically stated otherwise as apparent from the following discussions, it is appreciated that throughout the present detailed description, discussions utilizing terms such as "sensing", "generating", "sending", "utilizing", "gauging", or the like, refer to the actions and processes of a computer system, or similar electronic computing device. The computer system or similar electronic computing device manipulates and transforms data represented as physical (electronic) quantities within the computer system's registers and memories into other data similarly represented as physical quantities within the computer system memories or registers or other such information storage, transmission, or display devices. Embodiments of the present technology are also well suited to the use of other computer systems such as, for example, optical and mechanical computers.

Overview of Discussion

Embodiments in accordance with the present technology pertain to a reversible air flow fan system (RAFFS) and its usage. In one embodiment in accordance with the present technology, the RAFFS described herein enables the indication of a direction of air flow within a switch coupled with a datacenter rack.

A datacenter rack may comprise multiple switches. Each switch is enclosed by a chassis and has its own cooling system. For example, while a fan internal to the chassis is in operation, cool air enters a first side of a chassis, while hot air exits the opposite second side of the chassis. Embodiments of the present technology enable the switch's internal fan to be easily repositioned within a stationary chassis such that the chassis's first side becomes the hot air exit while the chassis's second opposite side becomes the cool air's entrance. In other words, the air flow direction within a switch may be easily reversed with a minimal amount of effort and risk.

More particularly, in accordance with embodiments of the present technology, RAFFS comprises a sensor coupled with a fan tray assembly, and a removable fan and bracket assembly coupled with a bracket. In one embodiment, a RAFFS is configured such that when the sensor is coupled with the bracket, the sensor knows which way the air is flowing within the switch. Similarly, when the sensor is not coupled with the removable fan and bracket assembly via the bracket, the sensor also knows which way the air is flowing within the switch. The removable fan and bracket assembly itself may be flipped in order to enable reversing the direction of the air flow within the switch.

Thus, since the bracket is coupled with the removable fan and bracket assembly, when the removable fan and bracket assembly is flipped, the attached bracket is also flipped, and consequently acquires a new position. If, as a result of flipping the removable fan and bracket assembly, the bracket becomes coupled with the sensor, then the operator knows that the air flow within the switch is moving in a first direction. Whereas, if, as a result of flipping the removable fan and bracket assembly, the bracket does not become coupled with the sensor, then the operator knows that the air flow within the switch is moving in a second direction, opposite that of the first direction.

The sensor may then send a signal to a human and/or a computing device regarding its orientation. This signal indicates information used to determine such things as but not limited to the air flow's direction and whether or not the fan within the switch is faulty. Furthermore, based on the determined direction of the air flow, temperature sensors positioned within the switch may be triggered to perform. In addition to monitoring the direction of the air flow within the chassis, and utilizing a novel removable fan and bracket assembly comprising the switch, embodiments of the present technology enable the switch to be repositioned such that the air flow's direction is reversed relative to the switch.

Reversible Air Flow Fan System

FIG. 1 is a block diagram of an example reversible air flow fan system (RAFFS) 100 in accordance with embodiments of the present technology. RAFFS 100 includes fan tray assembly 105, chassis 110, removable fan and bracket assembly 115, air duct 125, and sense switch 140. Further, embodiments of the present technology further comprise fan cable 150, connector 155, and light emitting diode 160.

Referring to FIG. 1, in one embodiment, fan tray assembly 105 is coupled with chassis 110. Chassis 110 is configured for being mounted on a server rack. Removable fan and bracket assembly 115 is oriented in a first direction 120, as shown by the arrows, and coupled with fan tray assembly 105 via a variety of coupling methods such as but not limited to at least one screw 165a and/or 165b. It is noted that any number of screws may couple removable fan and bracket assembly 115 with fan tray assembly 105.

Figure 3:
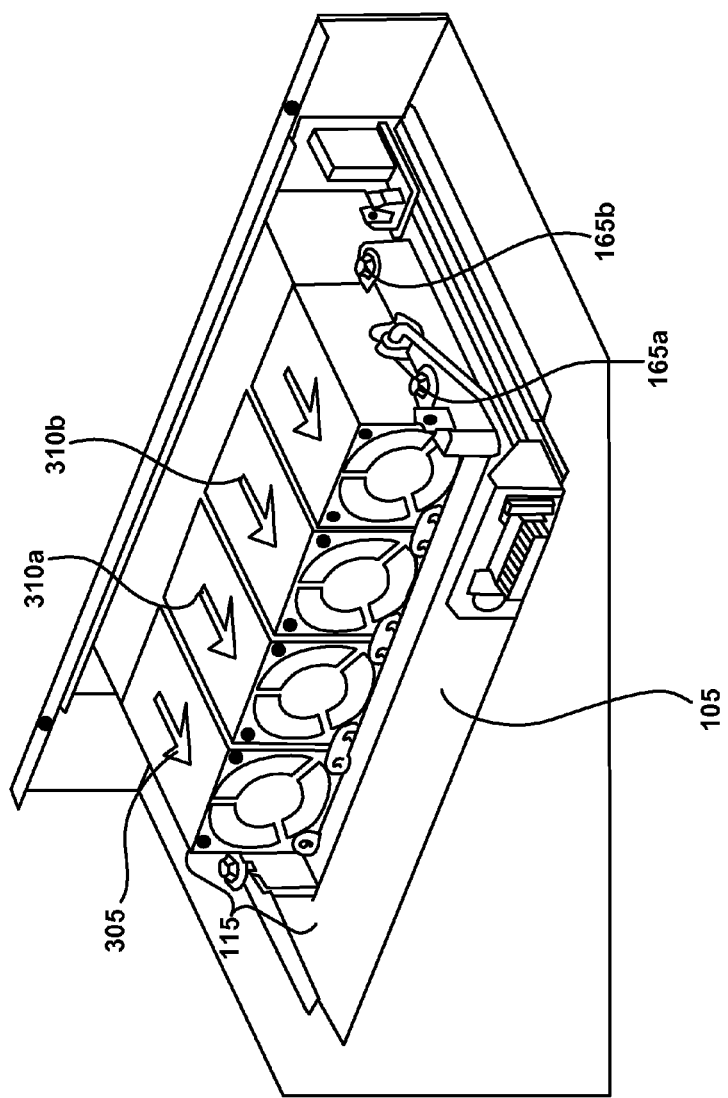
FIG. 3 is a block diagram of an example reversible air flow fan system in accordance with embodiments of the present technology.

In one embodiment, removable fan and bracket assembly 115 is configured for being removed from fan tray assembly 105 and being recoupled with fan tray assembly 105 in a second direction 305 of FIG. 3, as shown by the arrows 170a and 170b. Of note, second direction 305 is opposite first direction 120. It is noted that the direction of the arrows 310a and 310b shown in FIG. 3 in line with the positioning of removable fan and bracket assembly 115 of FIG. 3 is opposite the direction of the arrows 170a and 170b shown in FIG. 1 in line with the positioning of removable fan and bracket assembly 115. Additionally, in one embodiment, fan tray assembly 105 is removable from chassis 110.

In another embodiment, removable fan and bracket assembly 115 is coupled with fan cable 50 and connector 155. Fan cable 150 is configured for carrying power to at least one fan 135. Connector 155 is configured for coupling removable fan and bracket assembly 115 with a computer, such as computer 600 of FIG. 6, and as will be described herein.

In one embodiment, air duct 125 is coupled with removable fan and bracket assembly 115 and a first surface 130 of chassis 110. Air duct 125 is configured to enable an exchange of air between removable fan and bracket assembly 115 and first surface 130 of chassis 110. This exchange of air is generated by the at least one fan 135 comprising removable fan and bracket assembly 115.

In another embodiment of the present technology, sensor 140 is coupled with fan tray assembly 105. Sensor 140 is configured for coupling with at least one bracket 145 of removable fan and bracket assembly 115 when removable fan and bracket assembly 115 is oriented in first direction 120. Sensor 140 is configured for sending air flow information via an electrical signal to computer 600 that is coupled with fan tray assembly 105.

In one embodiment, sensor 140 is coupled with light emitting diode 160. Light emitting diode 160 may provide various indications to a user of conditions occurring within system 100. For example, light emitting diode 160 may flash a light sequence to represent information such as air flowing in a direction opposite than that which is necessary for a properly functioning heating and cooling system, thus alarming an operator to the need for an immediate reversal of the switch.

In another embodiment, fan and bracket assembly 115 comprise at least one directional indicator associated with the exchange of air. For example, a directional indicator may be but is not limited to an arrow, 170a and/or 170b, pointing in the direction of the air flow within the switch.

In another embodiment, direction indicator may be at least one bracket 145 being coupled with sensor 140, wherein a presence of said at least one bracket 145 coupled with sensor 140 indicates that said exchange of air is flowing in a first direction 120. Similarly, a lack of presence of said at least one bracket 145 coupled with sensor 140 indicates that said exchange of air is flowing in second direction 305.

Operation

More generally, in embodiments in accordance with the present technology, RAFFS 100 is utilized to indicate a direction of air flow within a switch that is coupled with a datacenter rack. Such a method of indicating a direction of air flow within a switch is particularly useful to determine the need for repositioning of a removable fan and bracket assembly 115 within chassis 110.

Figure 4:
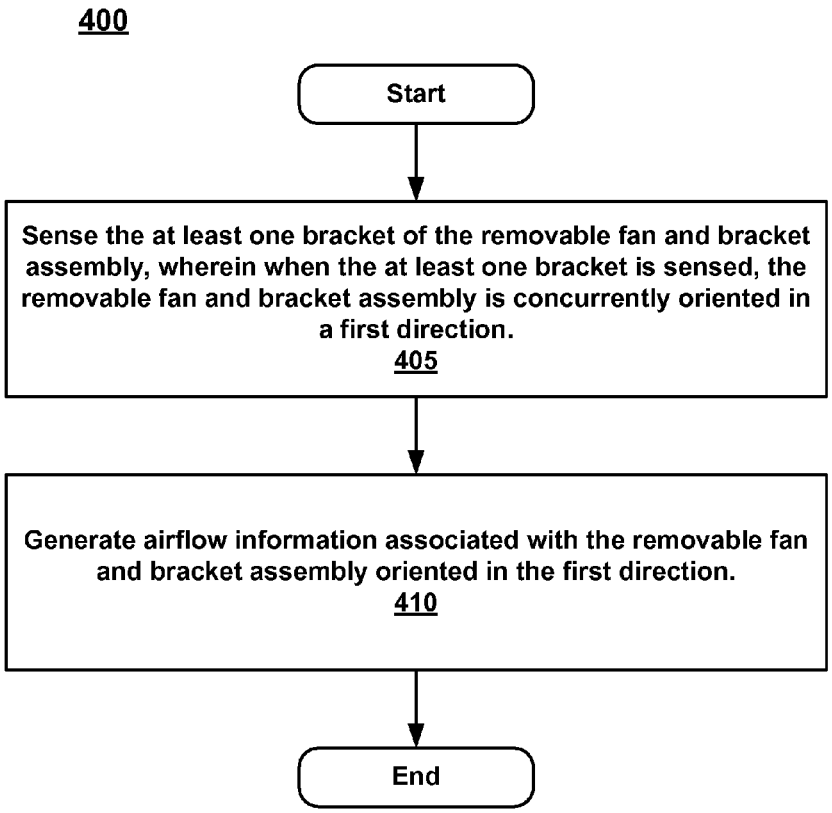
FIG. 4 is a flowchart of an example computer-implemented method for indicating a direction of air flow within a switch that is coupled with a datacenter rack in accordance with embodiments of the present technology.

Referring now to 400 of FIG. 4, a flowchart of an example computer-implemented method of indicating a direction of an air flow within a switch coupled with a datacenter rack in accordance with embodiments of the present technology is shown.

Referring to 405 of FIG. 4, in one embodiment of the present technology, at least one bracket 145 of removable fan and bracket assembly 115 is sensed, wherein when the at least one bracket 115 is sensed the removable fan and bracket assembly 115 is oriented in first direction 120. In one embodiment, a removable fan tray assembly is utilized as fan tray assembly 115.

Referring now to 410 of FIG. 4, in one embodiment of the present technology, air flow information associated with removable fan and bracket assembly 115 that is oriented in first direction 120 is generated. In another embodiment, generating air flow information comprises utilizing light emitting diode 160, as already described herein.

In another embodiment, an absence of the at least one bracket 145 is sensed, wherein when the absence is sensed removable fan and bracket assembly 115 is oriented in second direction 305. Air flow information associated with removable fan and bracket assembly 115 that is oriented in second direction 305 is generated.

In one embodiment, generating air flow information comprises indicating that a position of fan and bracket assembly 115 should be reversed based on the air flow information. In another embodiment, generating air flow information comprises indicating whether at least one fan 135 of fan and bracket assembly 115 is faulty. For example, sensor 140 may generate a signal indicating that it is coupled with bracket 145 and thus the flow of air is in the direction of the arrows 170a and 170b. However, air may not be flowing in the directions of the arrows 170a and 170b or air may not be flowing at all. Therefore, ultimately, sensor 140 generated information that enabled an operator of the switch to determine that the fan is faulty. In another embodiment, and similarly, the generation of air flow information may indicate that a new fan should be ordered based on the at least one fan 135 being faulty.

In another embodiment, air flow information is sent via an electrical signal to a computer that is coupled with fan tray assembly 115.

Referring to 410 of FIG. 4, information for the determination of the direction of the exchange of air by sense switch 140 is indicated. In one embodiment, this indication is provided by an electrical signal. Sense switch 140 is coupled with fan tray assembly 105 and configured for coupling with at least one bracket 145 of removable fan and bracket assembly 115 when removable fan and bracket assembly 115 is oriented in first direction 120.

Figure 2:
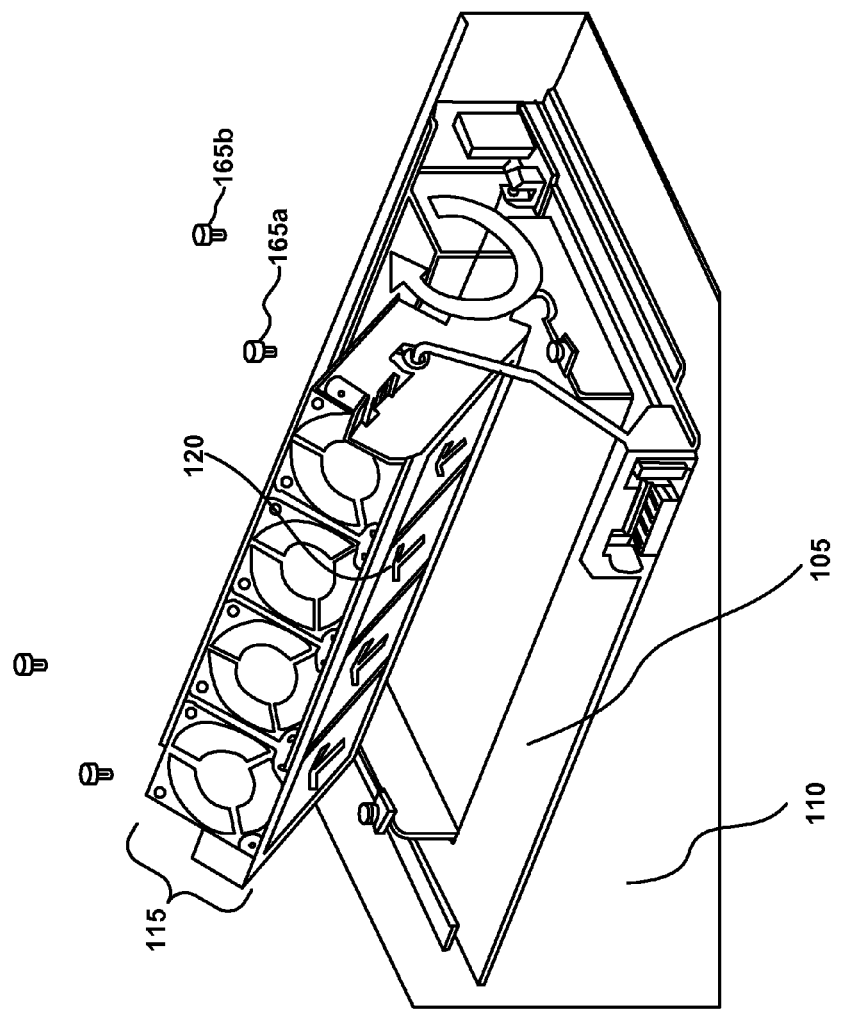
FIG. 2 is a block diagram of an example reversible air flow fan system in accordance with embodiments of the present technology.
Figure 5:
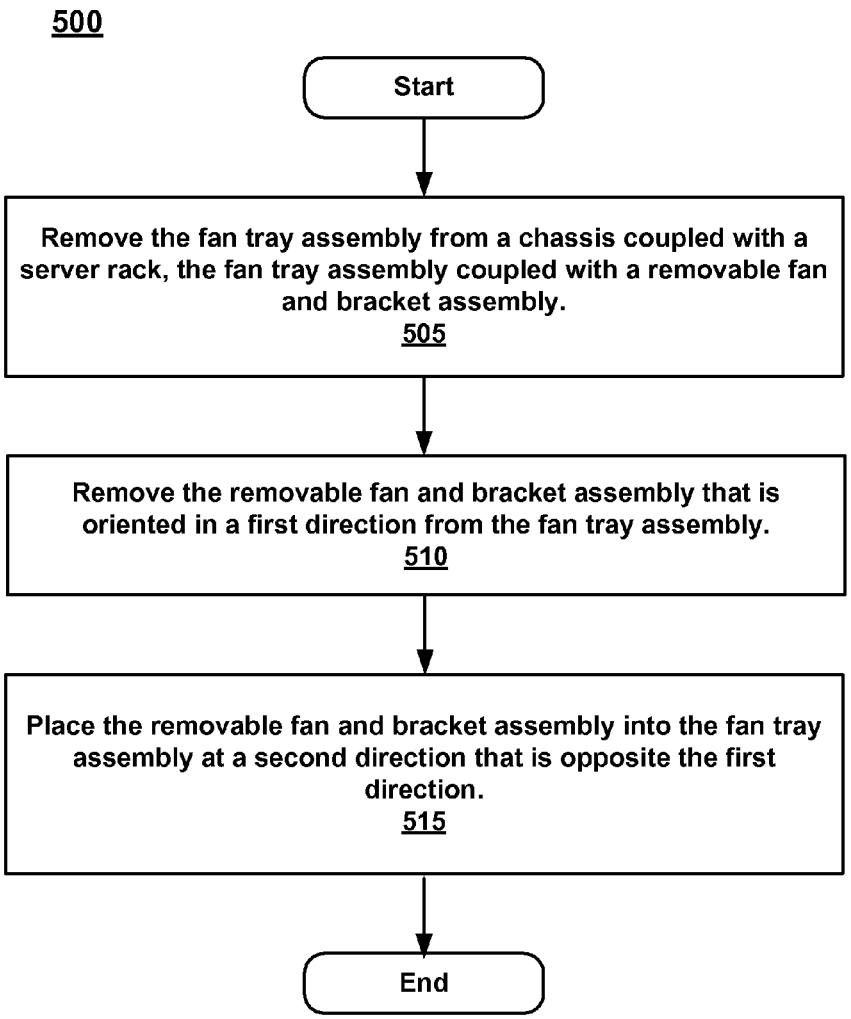
FIG. 5 is a flowchart of an example method for reversing a direction of air flow within a chassis that is coupled with a datacenter rack in accordance with embodiments of the present technology.

Referring to 500 of FIG. 5, a method of reversing a direction of air flow within a chassis that is coupled with a data-center rack is shown in accordance with embodiments of the present technology. Referring now to FIG. 2 and to 505 of FIG. 5, in one embodiment, fan tray assembly 105 is removed from chassis 110 that is coupled with a server rack. Fan tray assembly 115 is coupled with removable fan and bracket assembly 115.

Referring to FIG. 2 and to 510 of FIG. 5, in one embodiment, removable fan and bracket assembly 115 that is oriented in first direction 120 is removed from fan tray assembly 105. A mechanism, such as but not limited to screws, that couples fan and bracket assembly 114 with fan tray assembly 105 is loosened. Fan and bracket assembly 115 is then lifted up above fan tray assembly 105.

Referring now to FIGS. 3 and 515 of FIG. 5, in one embodiment removable fan and bracket assembly 115 is placed into fan tray assembly 105 at second direction 305 that is opposite first direction 120. In one embodiment, during placement, removable fan and bracket assembly 115 is rotated about a longwise centerline of removable fan and bracket assembly 115. Removable fan and bracket assembly 115 is then repositioned onto fan tray assembly 105, and the coupled with fan tray assembly 115. In one embodiment, a coupling mechanism such as but not limited to, screws 165a and 165b, is utilized.

Hence, the present invention enables one with little skill in the art to reconfigure the air flow direction of a switch with a minimum amount of effort and risk. Furthermore, the design of the RAFFS is user friendly.

Example Computer System Environment

Figure 6:
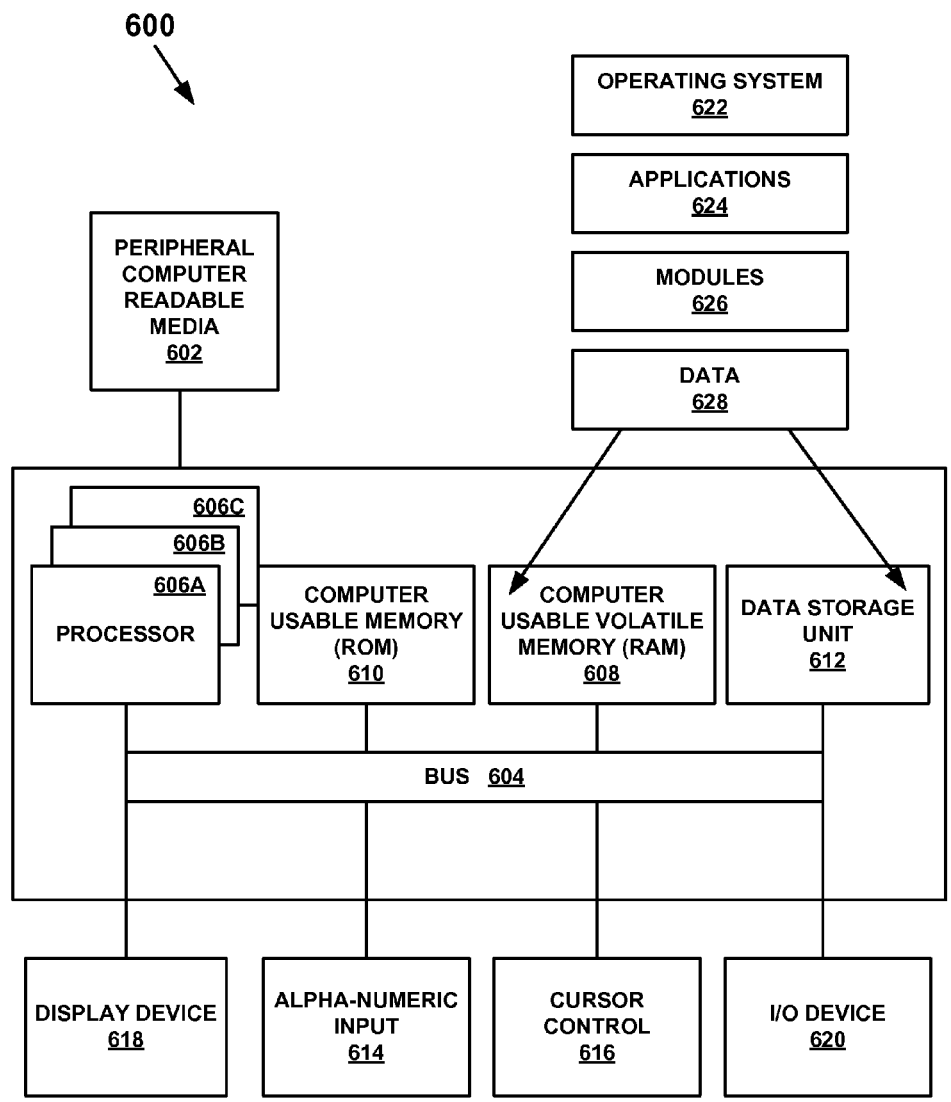
FIG. 6 is a diagram of an example computer system used for indicating a direction of air flow within a switch that is coupled with a datacenter rack in accordance with embodiments of the present technology.

FIG. 6 illustrates an example computer system 600 used in accordance with embodiments of the present technology. It is appreciated that system 600 of FIG. 6 is an example only and that embodiments of the present technology can operate on or within a number of different computer systems including general purpose networked computer systems, embedded computer systems, routers, switches, server devices, user devices, various intermediate devices/artifacts, stand alone computer systems, and the like. As shown in FIG. 6, computer system 600 of FIG. 6 is well adapted to having peripheral computer readable media 602 such as, for example, a compact disc, and the like coupled therewith.

System 600 of FIG. 6 includes an address/data bus 604 for communicating information, and a processor 606A coupled to bus 604 for processing information and instructions. As depicted in FIG. 6, system 600 is also well suited to a multi-processor environment in which a plurality of processors 606A, 606B, and 606C are present. Conversely, system 600 is also well suited to having a single processor such as, for example, processor 606A. Processors 606A, 606B, and 606C may be any of various types of microprocessors. System 600 also includes data storage features such as a computer usable volatile memory 608, e.g. random access memory (RAM), coupled to bus 604 for storing information and instructions for processors 606A, 606B, and 606C.

System 600 also includes computer usable non-volatile memory 610, e.g. read only memory (ROM), coupled to bus 604 for storing static information and instructions for processors 606A, 606B, and 606C. Also present in system 600 is a data storage unit 612 (e.g., a magnetic or optical disk and disk drive) coupled to bus 604 for storing information and instructions. System 600 also includes an optional alpha-numeric input device 614 including alphanumeric and function keys coupled to bus 604 for communicating information and command selections to processor 606A or processors 606A, 606B, and 606C. System 600 also includes an optional cursor control device 616 coupled to bus 604 for communicating user input information and command selections to processor 606A or processors 606A, 606B, and 606C. System 600 of the present embodiment also includes an optional display device 618 coupled to bus 604 for displaying information.

Referring still to FIG. 6, optional display device 618 of FIG. 6 may be a liquid crystal device, cathode ray tube, plasma display device or other display device suitable for creating graphic images and alpha-numeric characters recognizable to a user. Optional cursor control device 616 allows the computer user to dynamically signal the movement of a visible symbol (cursor) on a display screen of display device 618. Many implementations of cursor control device 616 are known in the art including a trackball, mouse, touch pad, joystick or special keys on alpha-numeric input device 614 capable of signaling movement of a given direction or manner of displacement. Alternatively, it will be appreciated that a cursor can be directed and/or activated via input from alpha-numeric input device 614 using special keys and key sequence commands.

System 600 is also well suited to having a cursor directed by other means such as, for example, voice commands. System 600 also includes an I/O device 620 for coupling system 600 with external entities.

Referring still to FIG. 6, various other components are depicted for system 600. Specifically, when present, an operating system 622, applications 624, modules 626, and data 628 are shown as typically residing in one or some combination of computer usable volatile memory 608, e.g. random access memory (RAM), and data storage unit 612. However, it is appreciated that in some embodiments, operating system 622 may be stored in other locations such as on a network or on a flash drive; and that further, operating system 622 may be accessed from a remote location via, for example, a coupling to the internet. In one embodiment, the present invention, for example, is stored as an application 624 or module 626 in memory locations within RAM 608 and memory areas within data storage unit 612.

Computing system 600 is only one example of a suitable computing environment and is not intended to suggest any limitation as to the scope of use or functionality of embodiments of the present technology. Neither should the computing environment 600 be interpreted as having any dependency or requirement relating to any one or combination of components illustrated in the example computing system 600.

Embodiments of the present technology may be described in the general context of computer-executable instructions, such as program modules, being executed by a computer. Generally, program modules include routines, programs, objects, components, data structures, etc., that perform particular tasks or implement particular abstract data types. Embodiments of the present technology may also be practiced in distributed computing environments where tasks are performed by remote processing devices that are linked through a communications network. In a distributed computing environment, program modules may be located in both local and remote computer-storage media including memory-storage devices.

Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A reversible air flow system comprising:
a fan tray assembly coupled with a chassis, said chassis configured to be mounted on a datacenter rack;
a removable fan and bracket assembly oriented in a first direction and coupled with said fan tray assembly, said removable fan and bracket assembly configured to be removable from said fan tray assembly and configured to be recoupled with said fan tray assembly in a second direction opposite said first direction;
an air duct coupled with said removable fan and bracket assembly and coupled with a first surface of said chassis, said air duct configured to enable an exchange of air between said removable fan and bracket assembly and said first surface of said chassis, said exchange of air generated by at least one fan of said removable fan and bracket assembly; and
a sensor coupled with said fan tray assembly, said sensor configured for coupling with at least one bracket of said removable fan and bracket assembly when said removable fan and bracket assembly is oriented in said first direction.

2. The system of claim 1, wherein said fan tray assembly is removable.

3. The system of claim 1, wherein said removable fan and bracket assembly is coupled with a fan cable, said fan cable configured for carrying power to said at least one fan.

4. The system of claim 1, wherein said removable fan and bracket assembly is coupled with a connector, said connector configured for coupling said removable fan and bracket assembly with a computer.

5. The system of claim 1, wherein said sensor is coupled with a light emitting diode.

6. The system of claim 1, wherein said fan and bracket assembly comprise at least one directional indicator associated with said exchange of air.

7. The system of claim 6, wherein said at least one directional indicator is an arrow pointing in the direction of the air flow.

8. The system of claim 6, wherein said at least one directional indicator is said at least one bracket being coupled with said sensor, wherein a presence of said at least one bracket coupled with said sensor indicates that said exchange of air is flowing in a first direction, and a lack of presence of said at least one bracket coupled with said sensor indicates that said exchange of air is flowing in a second direction.

9. A computer-implemented method for indicating a direction of air flow within a switch that is coupled with a server rack, said method comprising:
sensing at least one bracket of a removable fan and bracket assembly coupled with a sensor, said removable fan and bracket assembly coupled with a fan tray assembly, wherein when said at least one bracket coupled with said sensor is sensed, said removable fan and bracket assembly is concurrently oriented in a first direction; and
generating air flow information associated with said removable fan and bracket assembly that is oriented in said first direction.

10. The method of claim 9, further comprising:
sensing an absence of said at least one bracket, wherein when said absence is sensed said removable fan and bracket assembly is concurrently oriented in a second direction; and
generating air flow information associated with said removable fan and bracket assembly that is oriented in said second direction.

11. The method of claim 9, further comprising:
sending said air flow information via an electrical signal to a computer coupled with said fan tray assembly.

12. The method of claim 9, wherein said generating air flow information comprises:
utilizing a light emitting diode.

13. The method of claim 9, wherein said generating air flow information further comprises:
based on said air flow information, indicating that a position of said removable fan and bracket assembly should be reversed.

14. The method of claim 13, wherein said generating air flow information further comprises:
indicating that at least one fan of said removable fan and bracket assembly is faulty.

15. A method of reversing a direction of air flow within a chassis that is coupled with a server rack, said method comprising:
removing a fan tray assembly from a chassis coupled with a server rack, said fan tray assembly coupled with a removable fan and bracket assembly;
removing said removable fan and bracket assembly that is oriented in a first direction from said fan tray assembly; and
placing said removable fan and bracket assembly into said fan tray assembly at a second direction that is opposite said first direction.

16. The method of claim 15, wherein removing said removable fan and bracket assembly further comprises:
loosening a mechanism that couples said removable fan and bracket assembly with said fan tray assembly; and
lifting up said removable fan and bracket assembly above said fan tray assembly.

17. The method of claim 15, wherein placing said fan and bracket assembly into said fan tray assembly further comprising:
rotating said fan and bracket assembly about a longwise centerline of said removable fan and bracket assembly;
repositioning said removable fan and bracket assembly onto said fan tray assembly; and
coupling said removable fan and bracket assembly with said fan tray assembly.

18. The method of claim 17, wherein coupling said fan and bracket assembly with said fan tray assembly further comprises:
utilizing screws for said coupling.

* * * * *